(12) United States Patent
Nashida

(10) Patent No.: US 9,852,968 B2
(45) Date of Patent: Dec. 26, 2017

(54) SEMICONDUCTOR DEVICE INCLUDING A SEALING REGION

(71) Applicant: FUJI ELECTRIC CO., LTD., Kawasaki-shi (JP)

(72) Inventor: Norihiro Nashida, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/643,418

(22) Filed: Mar. 10, 2015

(65) Prior Publication Data

US 2015/0187689 A1    Jul. 2, 2015

Related U.S. Application Data

(63) Continuation of application No. PCT/JP2013/006591, filed on Nov. 8, 2013.

(30) Foreign Application Priority Data

Dec. 28, 2012 (JP) ................. 2012-287754

(51) Int. Cl.
*H01L 23/498* (2006.01)
*H01L 23/16* (2006.01)
(Continued)

(52) U.S. Cl.
CPC ........ *H01L 23/49811* (2013.01); *H01L 23/10* (2013.01); *H01L 23/16* (2013.01);
(Continued)

(58) Field of Classification Search
CPC ............. H01L 23/481; H01L 29/41708; H01L 29/408; H01L 25/18; H01L 23/49844;
(Continued)

(56) References Cited

U.S. PATENT DOCUMENTS

| 5,958,515 A | 9/1999 | Isshiki et al. |
| 2005/0045369 A1 | 3/2005 | Ishimaru et al. |

(Continued)

FOREIGN PATENT DOCUMENTS

| CN | 101546716 A | 9/2009 |
| CN | 101740710 A | 6/2010 |

(Continued)

OTHER PUBLICATIONS

International Search Report issued in PCT/JP2013/006591, dated Feb. 4, 2014. English translation provided.

(Continued)

*Primary Examiner* — Shahed Ahmed
(74) *Attorney, Agent, or Firm* — Rossi, Kimms & McDowell LLP

(57) ABSTRACT

The semiconductor device includes an insulating substrate on which is mounted a main circuit part including a semiconductor chip, a printed substrate wherein a conductive connection member connected to the semiconductor chip is disposed on the surface opposing the insulating substrate, a first sealing member that seals so as to enclose the semiconductor chip between the opposing surfaces of the insulating substrate and printed substrate, and a second sealing member that covers the whole excepting a bottom portion of the insulating substrate, the semiconductor device having sealing region regulation rod portions disposed in an outer peripheral portion of a sealing region of the first sealing member and connected between the insulating substrate and printed substrate, wherein the heat resistance temperature of the first sealing member is set to be higher than the heat resistance temperature of the second sealing member.

12 Claims, 12 Drawing Sheets

(51) Int. Cl.
- H01L 23/31 (2006.01)
- H01L 25/16 (2006.01)
- H01L 23/10 (2006.01)
- H01L 23/495 (2006.01)
- H01L 23/373 (2006.01)
- H01L 23/433 (2006.01)

(52) U.S. Cl.
CPC ...... *H01L 23/3121* (2013.01); *H01L 23/3135* (2013.01); *H01L 23/3735* (2013.01); *H01L 23/4334* (2013.01); *H01L 23/49506* (2013.01); *H01L 23/49575* (2013.01); *H01L 23/49833* (2013.01); *H01L 25/162* (2013.01); *H01L 2224/48091* (2013.01); *H01L 2924/1305* (2013.01); *H01L 2924/13055* (2013.01); *H01L 2924/13091* (2013.01)

(58) Field of Classification Search
CPC ... H01L 21/563; H01L 23/28; H01L 23/3135; H01L 2224/291; H01L 23/49506; H01L 23/49575; H01L 23/49811; H01L 23/49833; H01L 25/162; H01L 23/10; H01L 23/16; H01L 23/3121; H01L 23/3735; H01L 23/4334
USPC .... 257/47, 164, 176, 197, 787, 788; 438/26, 438/51, 64, 112, 170, 189, 234, 612
See application file for complete search history.

(56) References Cited

U.S. PATENT DOCUMENTS

| | | | | |
|---|---|---|---|---|
| 2006/0108601 | A1* | 5/2006 | Okamoto | C23C 4/02 257/177 |
| 2007/0284719 | A1* | 12/2007 | Shiota | H01L 23/24 257/687 |
| 2009/0246910 | A1* | 10/2009 | Taniguchi | H01L 23/5385 438/107 |
| 2009/0263938 | A1 | 10/2009 | Ino | |
| 2010/0078791 | A1 | 4/2010 | Yim et al. | |
| 2010/0123151 | A1* | 5/2010 | Hata | H01L 33/44 257/98 |
| 2011/0037155 | A1 | 2/2011 | Pagaila | |
| 2011/0260336 | A1 | 10/2011 | Kang et al. | |
| 2012/0236502 | A1* | 9/2012 | Yamaguchi | H01L 23/373 361/704 |

FOREIGN PATENT DOCUMENTS

| | | |
|---|---|---|
| JP | 05175375 A | 7/1993 |
| JP | 08064759 A | 3/1996 |
| JP | 09321182 A | 12/1997 |
| JP | 10079454 A | 3/1998 |
| JP | 2009064852 A | 3/2009 |
| JP | 2009200088 A | 9/2009 |
| JP | 2009231690 A | 10/2009 |
| JP | 2009260132 A | 11/2009 |
| JP | 2010087516 A | 4/2010 |
| JP | 2011001412 A | 1/2011 |
| JP | 2011049502 A | 3/2011 |

OTHER PUBLICATIONS

Extended European Search Report issued in European Appln. No. 13869756.0 dated Jun. 20, 2016.

Office Action issued in Chinese Appln. No. 201380047933.X dated Nov. 30, 2016. English translation provided.

* cited by examiner

SEMICONDUCTOR DEVICE INCLUDING A SEALING REGION

CROSS-REFERENCE TO RELATED APPLICATIONS

This application is a continuation of International Application No. PCT/JP2013/006591, filed on Nov. 8, 2013, which is based on and claims priority to Japanese Patent Application No. JP 2012-287754, filed on Dec. 28, 2012. The disclosure of the Japanese priority application and the PCT application in their entirety, including the drawings, claims, and the specification thereof, are incorporated herein by reference.

BACKGROUND OF THE INVENTION

1. Field of the Invention

The present invention relates to a semiconductor device such as a power device or high frequency use switching IC, and in particular, relates to a semiconductor device in which is mounted a power semiconductor element.

2. Related Art

A semiconductor device (power semiconductor module) is used in an inverter device, uninterruptible power supply device, machine tool, industrial robot, and the like, independently of a main body thereof. A semiconductor device (semiconductor module) including at least one semiconductor element (semiconductor chip) joined onto a metal foil formed on an insulating plate, a printed substrate disposed opposing the semiconductor element (semiconductor chip), and a plurality of post electrodes that electrically connect at least one of metal foils formed on first and second main surfaces of the printed substrate and at least one main electrode of the semiconductor element (semiconductor chip), has been proposed as the power semiconductor module. See, for example, Japanese Patent Application Publication No. JP-A-2009-64852 (also referred to herein as "PTL 1").

This semiconductor device, as shown in FIGS. 12A and 12B, is a type of semiconductor module wherein the main electrodes of the semiconductor chip are electrically connected by a plurality of post electrodes. A semiconductor module 201 has a structure wherein an insulating substrate 202 and an implant printed substrate 203 (hereafter called simply a printed substrate) caused to oppose the insulating substrate 202 are sealed by an under filling material, resin material, or the like, 204, thereby becoming integrated. A plurality of semiconductor chips 205 are mounted on the insulating substrate 202.

Furthermore, the semiconductor module 201 is packaged with a resin case (not shown), and functions as, for example, a general-purpose IGBT module. The insulating substrate 202 includes an insulating plate 206, a metal foil 207 formed on the lower surface of the insulating plate 206 using a DCB (Direct Copper Bonding) method, and a plurality of metal foils 208 formed on the upper surface of the insulating plate 206, also using a DCB method. The semiconductor chips 205 are joined onto the metal foils 208 across a lead free solder layer 209 of a tin (Sn)-silver (Ag) series.

Also, the printed substrate 203 is of a multilayer structure wherein, for example, a resin layer 213 is disposed in a central portion, metal foils 214 are formed by patterning on the upper surface and lower surface of the resin layer 213, and the metal foils 214 are covered by protective layers 215. A plurality of through holes 210 are provided in the printed substrate 203, a thin, tubular plating layer (not shown) that electrically connects the upper surface and lower surface metal foils 214 is provided inside the through holes 210, and cylindrical post electrodes 211 are press fitted (implanted) across the tubular plating. Furthermore, the semiconductor chips 205 are joined to the post electrodes 211 across a solder layer 212. Further, the space between the printed substrate 203 and insulating plate 206 is filled with an under filling, and the under filling is sealed with a sealing member on the upper surface side of the printed substrate 203.

Also, a resin-sealed type power module device wherein, as shown in FIG. 13, a substrate 302 is disposed on a metal plate 301, semiconductor chips 303 are mounted on the substrate 302, the semiconductor chips 303 and external connection terminals 304 are electrically connected by bonding wire 305, a surrounding case 306 is attached to an outer peripheral portion of the metal plate 301, the semiconductor chips 303 are enclosed with silicone gel 307, and the upper surface side of the silicone gel 307 is sealed with an epoxy resin 308, has been proposed as another semiconductor device. See, for example, Japanese Patent Application Publication No. JP-A-8-64759 (also referred to herein as "PTL 2").

Furthermore, a resin-sealed type semiconductor device wherein an internal lead is electrically connected to an external terminal disposed on an element formation surface of a semiconductor pellet and, when the semiconductor pellet and internal lead are sealed with a resin sealing body, an internal sealing body, with low moisture permeability and a low Young's modulus in comparison with the resin sealing body, is provided between the semiconductor pellet and resin sealing body, has been proposed as another semiconductor device. See, for example, Japanese Patent Application Publication No. JP-A-5-175375 (also referred to herein as "PTL 3").

Also, a two layer resin-sealed type semiconductor device wherein a semiconductor chip is sealed with an epoxy and silicone elastomer resin composition layer, and furthermore, the periphery thereof is sealed with an epoxy resin composition, has been proposed as another semiconductor device. See, for example, Japanese Patent Application Publication No. JP-A-9-321182 (also referred to herein as "PTL 4").

Also, an electrical part wherein a semiconductor element is disposed with adhesive on a circuit substrate, the upper surface of the semiconductor element is covered with a silicone hardener, and the silicone hardener is resin sealed with a sealing resin, has been proposed as another semiconductor device. See, for example, Japanese Patent Application Publication No. JP-A-10-79454 (also referred to herein as "PTL 5").

Furthermore, a flip chip type light emitting semiconductor device wherein a flip chip type light emitting semiconductor device silicone under filling material formed of a hardening silicone composition including 100 parts by mass of a thermal hardening liquid silicone composition and 100 to 400 parts by mass of a spherical non-organic filling material with a particle diameter of 50 μm or less and an average particle diameter of 0.5 to 10 μm, wherein oxide hardness at 25° C. (type A) is 40 or less, the Young's modulus is 2.0 mpa or less, and the linear expansion coefficient is 250 ppm or less, is applied as a silicone under filling material having excellent heat resistance and light resistance, and a high linear expansion coefficient in comparison with that of an epoxy resin, has been proposed as another resin-sealed type semiconductor device. See, for example, Japanese Patent Application Publication No. JP-A-2011-1412 (also referred to herein as "PTL 6").

Also, a semiconductor device mounting structure wherein a plate-form LSI (electronic part) is mounted on a substrate across a solder bump, an under filling resin (under filling material) filling the space between the LSI and the substrate is larger than the LSI when seen in plan view and disposed in a form similar to that of the LSI, protruding portions protruding from the substrate are provided in an under filling resin filling region in proximity to corner portions of the LSI and corresponding to positions farthest from the center of the LSI, the under filling resin moves to the protruding portions so as to be suctioned up to an upper portion along the surface of the protruding portions by surface tension, and the under filling resin concentrates in the corner portions of the LSI by concentrating on the protruding portions, covering the side surfaces of the LSI and the side surfaces of a low dielectric film disposed on the bottom surface of the LSI, has been proposed as another semiconductor device. See, for example, Japanese Patent Application Publication No. JP-A-2011-49502 (also referred to herein as "PTL 7").

Herein, in order for the characteristics of a power module in which is mounted a wide bandgap device of SiC (silicon carbide), GaN (gallium nitride), or the like, to be utilized to the full extent, operation at a temperature higher than that of existing power modules is necessary. When the operating temperature range reaches 250° C. or higher, there is a problem with the reliability of epoxy resin used heretofore as a sealing material in that thermal degradation occurs.

Therefore, the securing of reliability at high temperatures is being attempted by adopting a structure wherein the vicinity of a semiconductor element is filled with a sealing material (of a silicone series, a polyimide series, or the like) with still higher heat resistance. However, as these sealing materials are not suited to the formation of a module exterior in terms of mechanical properties and cost, the adoption of a double structure wherein the outer periphery is sealed with an epoxy resin is being carried out, as described in PTL 1 to 6.

When employing a double sealing structure in this way, it is possible to regulate outflow of the under filling material and epoxy resin when having the surrounding case 306, as described in PTL 2. Meanwhile, when not having a surrounding case, it may happen when filling the periphery of a semiconductor element with a sealing material that the sealing material flows into a region other than a predetermined sealing region. As a result of this, when having the insulating substrate 202 and printed substrate 203, as shown in FIG. 12, and furthermore, when the outer periphery of this package is covered with an epoxy resin, the attachment area between the epoxy resin on the outer periphery and the insulating substrate 202 and printed substrate 203 decreases, because of which, when carrying out a temperature cycle test or the like, there is an unresolved problem in that the epoxy resin is liable to become detached from the substrates and the sealing material on the semiconductor periphery, and resin cracking and substrate damage occur.

The semiconductor devices described in PTL 3 to 6, not having an insulating plate or printed substrate, are such that the periphery of a semiconductor element is sealed with a first sealing material, and the exterior of the first sealing material is sealed with a second sealing material. Because of this, there is no need to consider detachment between a substrate disposed on the upper surface side of the semiconductor element and the second sealing material, and the heretofore described unresolved problem does not occur. Also, in the case of the semiconductor device described in PTL 7 too, it is described only that the under filling resin is disposed in a similar form by using protruding portions on the periphery of the LSI, and no consideration is given to covering with an epoxy resin the whole of a structure in which an insulating substrate and printed substrate are disposed.

SUMMARY OF INVENTION

Therefore, the invention, having been contrived focusing on the unresolved problems of the existing examples, has an object of providing a semiconductor device such that, when a first sealing member is disposed between an insulating substrate and printed substrate, and a second sealing member is disposed covering the side surfaces of the insulating substrate, the side surfaces of the first sealing member, and the side surfaces and upper surface of the printed substrate, it is possible to prevent detachment of the second sealing member, thus increasing reliability.

In order to achieve the heretofore described object, a first aspect of a semiconductor device according to the invention includes an insulating substrate on which is mounted a main circuit component including a semiconductor chip, a printed substrate, opposing the insulating substrate, wherein a conductive connection member connected to the semiconductor chip is disposed on the surface opposing the insulating substrate, a first sealing member that seals so as to enclose the semiconductor chip between the opposing surfaces of the insulating substrate and printed substrate, and a second sealing member that covers the side surfaces of the insulating substrate, the side surfaces of the first sealing member, and the side surfaces and upper surface of the printed substrate. Further, the semiconductor device has sealing region regulation rod portions disposed in an outer peripheral portion of a sealing region of the first sealing member and connected between the insulating substrate and printed substrate, wherein the heat resistance temperature of the first sealing member is higher than the heat resistance temperature of the second sealing member.

According to the invention, it is possible to regulate accurately by sealing region regulation rod portions being disposed in the sealing region of a first sealing member that seals a semiconductor chip between an insulating substrate and a printed substrate. Because of this, it is possible to secure the attachment area between a second sealing member, which seals the insulating substrate and printed substrate, and the insulating substrate and printed substrate, and thus possible to secure adhesive strength between the second sealing member and the insulating substrate and printed substrate. Consequently, it is possible to suppress resin detachment during a reliability test such as a temperature cycle test, and protect the sealed insulating substrate and printed substrate for a long period, and thus possible to increase the reliability of the semiconductor device.

Also, as it is possible to regulate the sealing region of the first sealing member using the disposition positions of the sealing region regulation rod portions, it is possible for a high temperature portion region in the vicinity of the semiconductor chip to be selectively filled with the first sealing member, and thus possible to reduce the amount used of an expensive heat resistant sealing material, thereby suppressing the manufacturing cost.

BRIEF DESCRIPTION OF THE DRAWINGS

FIGS. 12A and 12B are diagrams showing an existing example, wherein FIG. 12A is a plan view and FIG. 12B is a sectional view along an A-A line of FIG. 12A.

DETAILED DESCRIPTION

Figure 1:
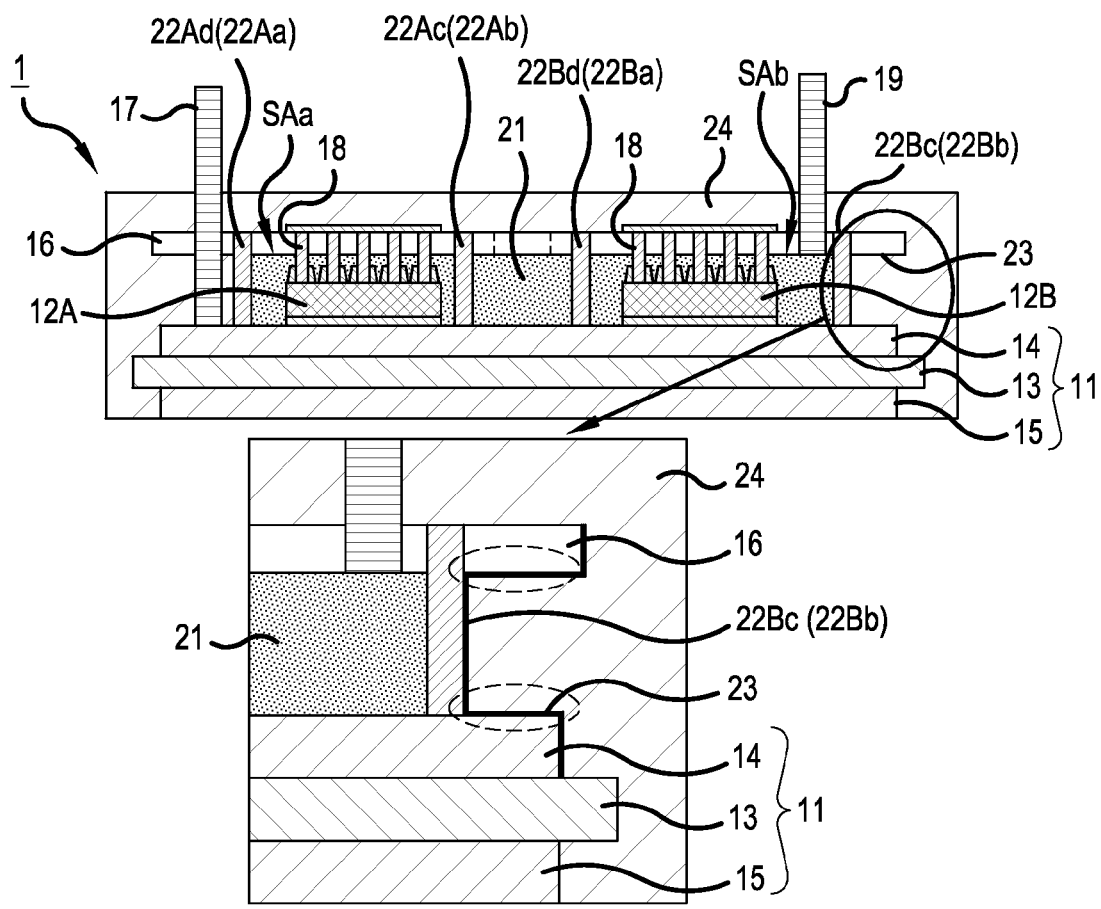
FIG. 1 is a vertical sectional view showing an enlargement of a main portion of a first embodiment of a semiconductor device according to the invention.

Hereafter, referring to the drawings, a description will be given of embodiments of the invention. FIG. 1 is a sectional view showing a semiconductor device according to the invention.

In the drawings, 1 is a power semiconductor module acting as a semiconductor device. The power semiconductor module 1 includes a first semiconductor chip 12A and second semiconductor chip 12B, each mounted on an insulating substrate 11 with a joining member such as a solder, and a printed substrate 16 that configures a common wiring circuit above the semiconductor chips 12A and 12B.

Each of the semiconductor chips 12A and 12B is a power semiconductor element such as a power MOSFET (Metal-Oxide-Semiconductor Field-Effect Transistor), insulated gate bipolar transistor (IGBT), or free wheeling diode (FWD).

Although the semiconductor chips 12A and 12B are one of the heretofore described kinds of power device, they may be formed on a silicon substrate, or may be formed on an SiC or other substrate.

In order to simplify the drawing, only the semiconductor chips 12A and 12B are shown in FIG. 1. One of the semiconductor chips 12A and 12B may be a power MOSFET (or IGBT), while the other is a FWD. Alternatively, semiconductor chips not shown in the drawing may be further disposed, thereby disposing two anti-parallel connection circuits of a power MOSFET (or IGBT) and a FWD.

The insulating substrate 11 has a substrate 13 of, for example, rectangular form seen from above having as a main component a ceramic such as alumina, which has good conductivity. A conductor pattern 14 configured of a copper plate with a thickness of, for example, 0.5 mm or more is attached to the front surface of the substrate 13, while a heat releasing heat transfer pattern 15 having the same kind of thickness is attached to the back surface.

Further, the semiconductor chips 12A and 12B are mounted on the conductor pattern 14 across joining members, such as solder, disposed maintaining a predetermined interval, and an external connection terminal 17 configured of a pin-form conductor is fixed to the conductor pattern 14 by fitting, or the like, on a left end portion side of the semiconductor chip 12A.

Also, electrodes are formed on the front surfaces of the semiconductor chips 12A and 12B, and a post electrode 18 formed on the printed substrate 16 is connected with a joining member such as solder to each electrode.

In the heretofore described example, a description has been given with solder as an example of the joining material between the conductor pattern 14 and the back surface electrodes (not shown) of the semiconductor chips 12A and 12B, and between the front surface electrodes (not shown) of the semiconductor chips 12A and 12B and the post electrodes 18, but the joining member is not limited to solder. For example, a metal paste wherein metal microparticles of silver or the like are kneaded with an organic solvent binder may be used. This kind of metal paste is such that the organic solvent is broken down by heating and pressurizing, and the metal microparticles are sintered, whereby a strong joining is obtained.

A predetermined conductor (wiring) pattern is formed on the front and back surfaces of the printed substrate 16, and a plurality of the post electrode 18 are fixed and supported in the printed substrate 16, penetrating the printed substrate 16. Furthermore, an external connection terminal 19 is formed protruding upward in the printed substrate 16.

Consequently, the insulating substrate 11 and printed substrate 16 are separated by a predetermined interval that is the sum of the thickness of the semiconductor chips 12A and 12B, the thickness of the joining member between the semiconductor chips 12A and 12B and the conductor pattern 14 of the insulating substrate 11, the thickness of the joining member between the post electrodes 18 and the semiconductor chips 12A and 12B, and the protruding height of the post electrodes 18.

Also, sealing region regulation rod portions 22Aa to 22Ad and 22Ba to 22Bd, which regulate sealing regions SAa and SAb of an under filling resin 21 acting as a first sealing member that seals the semiconductor chips 12A and 12B, are fixed between the insulating substrate 11 and printed substrate 16 in positions separated by a predetermined distance on the outer peripheral sides of the four corners of each of the semiconductor chips 12A and 12B.

The sealing region regulation rod portions 22Aa to 22Ad and 22Ba to 22Bd are configured of a material having wettability with respect to the under filling resin 21. As materials having wettability with respect to the under filling resin 21 there are, for example, copper, aluminum, nickel, tin, and the like.

Herein, post electrodes that electrically connect the conductor pattern 14 of the insulating substrate 11 and the conductor pattern formed on the printed substrate 16 may be employed as the sealing region regulation rod portions 22Aa to 22Ad and 22Ba to 22Bd. When the sealing region regulation rod portions double as post electrodes in this way, it is preferable that copper is selected as the material of the sealing region regulation rod portions. Even when copper is used for the sealing region regulation rod portions, the conductor pattern 14 of the insulating substrate 11 and the conductor pattern of the printed substrate 16 need not necessarily be electrically connected. A cylindrical form is shown as an example of the form of the sealing region regulation rod portions, but this is not limiting.

Also, for example, a comparatively expensive silicone series resin or polyimide series resin with a high heat resistance temperature of 250° C. or higher is applied as the under filling resin 21. For example, it is possible to use a resin used as a chip coating material of a discrete product.

Figure 2:
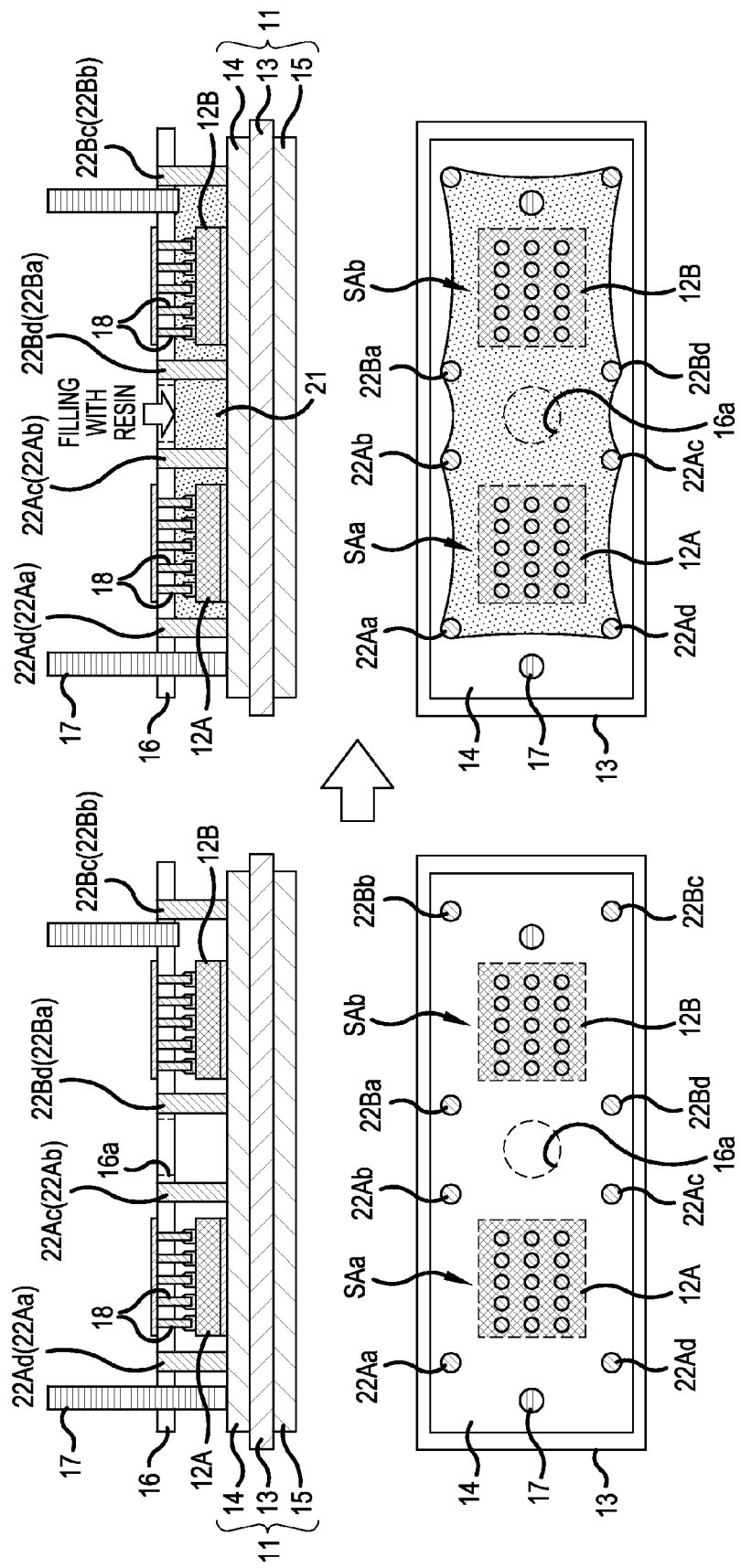
FIGS. 2A and 2B are vertical sectional views and lateral sectional views showing states before and after filling with an under filling resin.

Furthermore, as shown in FIGS. 2A and 2B, the sealing regions SAa and SAb of the under filling resin 21 are a predetermined interval outward from the outer peripheral edges of the semiconductor chips 12A and 12B, and set to be smaller than the conductor pattern 14 on the insulating substrate 11, and smaller than the printed substrate 16. Further, the two sealing regions SAa and SAb are linked at center side end portions.

Also, an inlet 16a through which the under filling resin 21 is injected is formed penetrating in a central position in the printed substrate 16.

Further, with the conductor pattern 14 of the insulating substrate 11 and the printed substrate 16 in an assembled state (referred to as an assembly), as shown in FIG. 2A, a predetermined amount of the under filling resin 21 is injected into the sealing regions SAa and SAb through the inlet 16a using a syringe, or the like, filled with the under filling resin 21 with the high heat resistance temperature.

By the under filling resin 21 being injected through the inlet 16a formed in a central portion of the printed substrate 16 in this way, the space between the conductor pattern 14 of the insulating substrate 11 and the printed substrate 16 becomes filled with the under filling resin 21.

Further, when the injected under filling resin 21 reaches the sealing region regulation rod portions 22Aa to 22Ad and 22Ba to 22Bd at the four corners of the semiconductor chips 12A and 12B, the under filling resin 21 moves so as to be suctioned up to an upper portion along the surfaces of the sealing region regulation rod portions 22Aa to 22Ad and 22Ba to 22Bd, and attempts to concentrate in the peripheries of the sealing region regulation rod portions 22Aa to 22Ad and 22Ba to 22Bd.

At this time, owing to the surface tension of the under filling resin 21, a large amount of the under filling resin 21 is drawn to the sealing region regulation rod portion 22Aa to 22Ad and 22Ba to 22Bd sides, covering the periphery of the semiconductor chips 12A and 12B, and covering the upper surfaces of the semiconductor chips 12A and 12B, whereby the under filling resin 21 completely fills the inside of the sealing regions SAa and SAb.

Herein, the sealing regions SAa and SAb, as shown in FIG. 2B, are of an extent completely covering the side surfaces of the semiconductor chips 12A and 12B and smaller than the conductor pattern 14 of the insulating substrate 11, and of an extent smaller than the printed substrate 16. Because of this, as shown in the enlarged view in FIG. 1, the under filling resin 21 is completely contained within a region enclosed by the sealing region regulation rod portions 22Aa to 22Ad and 22Ba to 22Bd that is inward of the outer peripheral edges of the conductor pattern 14 of the insulating substrate 11 and inward of the outer peripheral edges of the printed substrate 16.

Because of this, a laterally inclined U-shaped portion 23 is formed, enclosed on side surface sides by the upper surface of the conductor pattern 14 of the insulating substrate 11, a side surface of the under filling resin 21, and the lower surface of the printed substrate 16. At this time, it is possible to increase the attachment area of an epoxy resin 24, to be described hereafter, with the U-shaped portion 23. Moreover, the upper and lower inner surfaces forming the U-shaped portion 23 are configured of the conductor pattern 14 of the insulating substrate 11 and the conductor pattern formed on the lower surface of the printed substrate 16, formed of copper, which has high adhesive strength with respect to the epoxy resin 24 to be described hereafter.

The assembly for which the filling with the under filling resin 21 is completed is left for a predetermined time in an atmosphere of a predetermined temperature, thereby hardening the under filling resin 21. For example, the under filling resin 21 is hardened by being held in an isothermal tank, or the like, at 150° C. for a time of in the region of 60 minutes. The under filling resin need not necessarily be completely hardened, but it is desirable that the under filling resin is hardened to an extent such that, when injecting the epoxy resin to be described hereafter, the under filling resin is not pushed out and caused to flow away by the epoxy resin.

In this state, the low-cost epoxy resin 24, acting as a second sealing resin with a heat resistance temperature lower than that of the under filling resin 21, is injected in a state covered by a resin injection die (not shown), excepting the bottom surface of the heat releasing heat transfer pattern 15 of the insulating substrate 11. By so doing, the insulating substrate 11, under filling resin 21, sealing region regulation rod portions 22Aa to 22Ad and 22Ba to 22Bd, and printed substrate 16 are sealed with the epoxy resin 24.

Herein, the epoxy resin 24 is injected in a melted state from a cylinder into a heated (for example, in the region of 150° C.) resin injection mold (neither shown in the drawing). In order that the epoxy resin 24 fills the assembly with no gap, the melted epoxy resin 24 is injected into the resin injection mold at a predetermined pressure (for example, in the region of 10 MPa).

At this time, the epoxy resin 24, as shown in the enlarged view in FIG. 1, enters the U-shaped portion 23 enclosed by the conductor pattern 14 of the insulating substrate 11, the under filling resin 21, and the printed substrate 16, and the epoxy resin 24 is hardened in this state. Consequently, it is possible by form to suppress detachment between the epoxy resin 24 and the insulating substrate 11 and printed substrate 16.

In this case, as previously described, the epoxy resin 24 comes into contact with the conductor pattern 14 of the insulating substrate 11 and the conductor pattern of the printed substrate 16 on the upper and lower surfaces of the U-shaped portion 23, because of which comparatively high adhesive strength is obtained. Because of this, even when carrying out a temperature cycle test or the like, no detachment of the epoxy resin 24 occurs, and it is possible to reliably suppress resin cracking and substrate damage. Because of this, it is possible to increase the reliability of the semiconductor device.

Figure 3:
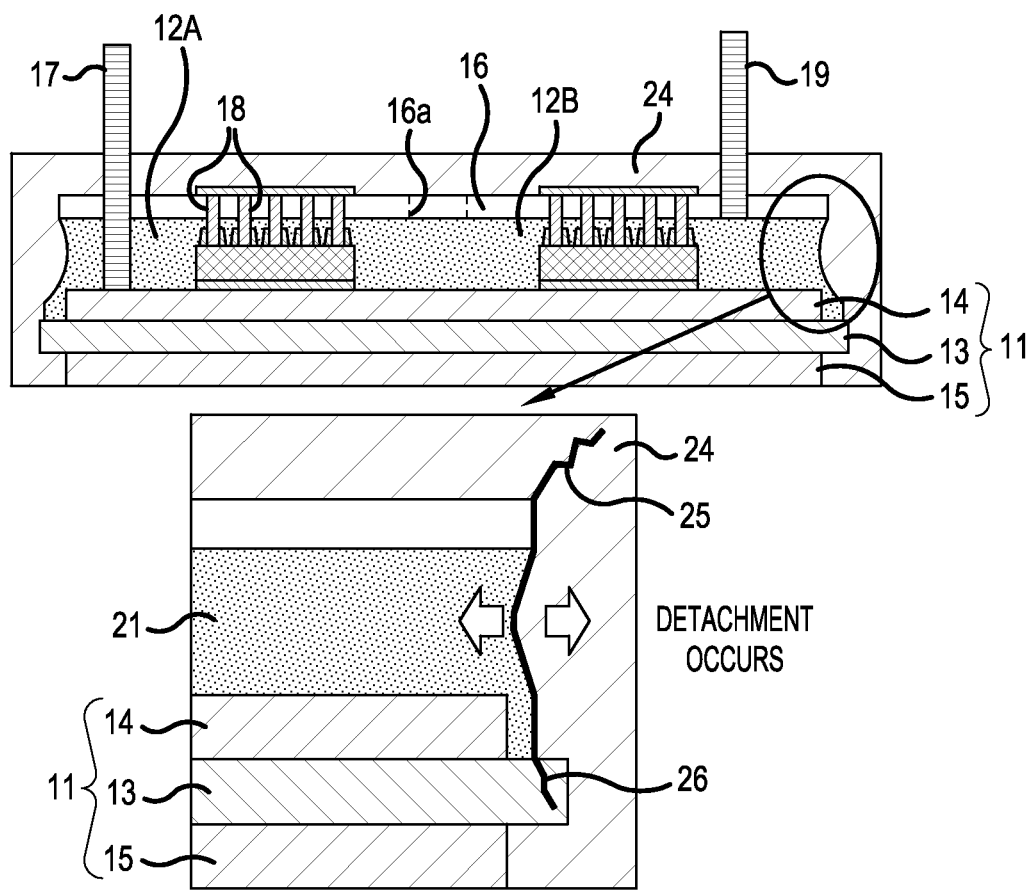
FIG. 3 is the same sectional view as FIG. 1 when not forming sealing region restriction rod portions.

Incidentally, when not disposing the sealing region regulation rod portions 22Aa to 22Ad and 22Ba to 22Bd, it is not possible to regulate the sealing regions SAa and SAb of the under filling resin 21, as shown in an enlargement of a main portion in FIG. 3, and it may happen that the under filling resin 21 exceeds the outer peripheral edges of the conductor pattern 14 of the insulating substrate 11, reaching the outer peripheral edges of the printed substrate 16.

When the whole of the space between the insulating substrate 11 and printed substrate 16 is filled with the under filling resin 21 in this way, it is not possible for the epoxy resin 24 covering the outer sides to enter between the conductor pattern 14 of the insulating substrate 11 and the printed substrate 16.

Because of this, adhesive strength is required between the under filling resin 21 and epoxy resin 24 but, a drop in adhesive strength compared with that of copper being undeniable, detachment is liable to occur. Together with this, it may happen that a resin crack 25 occurs in a position in contact with a corner portion of the printed substrate 16, or that a ceramic crack occurs in the ceramic substrate 13 configuring the insulating substrate 11, whereby the reliability of the semiconductor device decreases.

This embodiment is such that, as heretofore described, it is possible, by disposing the sealing region regulation rod portions 22Aa to 22Ad and 22Ba to 22Bd, to accurately regulate the sealing regions SAa and SAb of the under filling resin 21 acting as the heat resistant first sealing member that fills the space between the insulating substrate 11 and printed substrate 16. Because of this, it is possible to form the U-shaped portion 23 between the insulating substrate 11 and printed substrate 16 while reliably covering the semiconductor chips 12A and 12B, and fill the U-shaped portion 23 with the epoxy resin 24 acting as the second sealing member.

Consequently, it is possible to cause the epoxy resin 24 to come into contact with the copper forming the conductor pattern 14 configuring the insulating substrate 11 and the conductor pattern of the printed substrate 16, thereby increasing the adhesive strength. As a result of this, it is possible to prevent detachment of the epoxy resin 24, thus preventing the occurrence of resin cracks and of ceramic cracks in the insulating substrate 11, and thus possible to increase the reliability of the semiconductor device.

Also, the first embodiment is such that, as the inlet 16a is formed in a central portion of the printed substrate 16, it is possible to inject the under filling resin evenly into the left and right sealing regions SAa and SAb, and thus possible to form the sealing regions SAa and SAb with one injection.

In the heretofore described embodiment, a description has been given of a case wherein the sealing region regulation rod portions 22Aa to 22Ad and 22Ba to 22Bd are disposed on the outer sides of the four corners of the semiconductor chips 12A and 12B, but this is not limiting.

Figure 4:
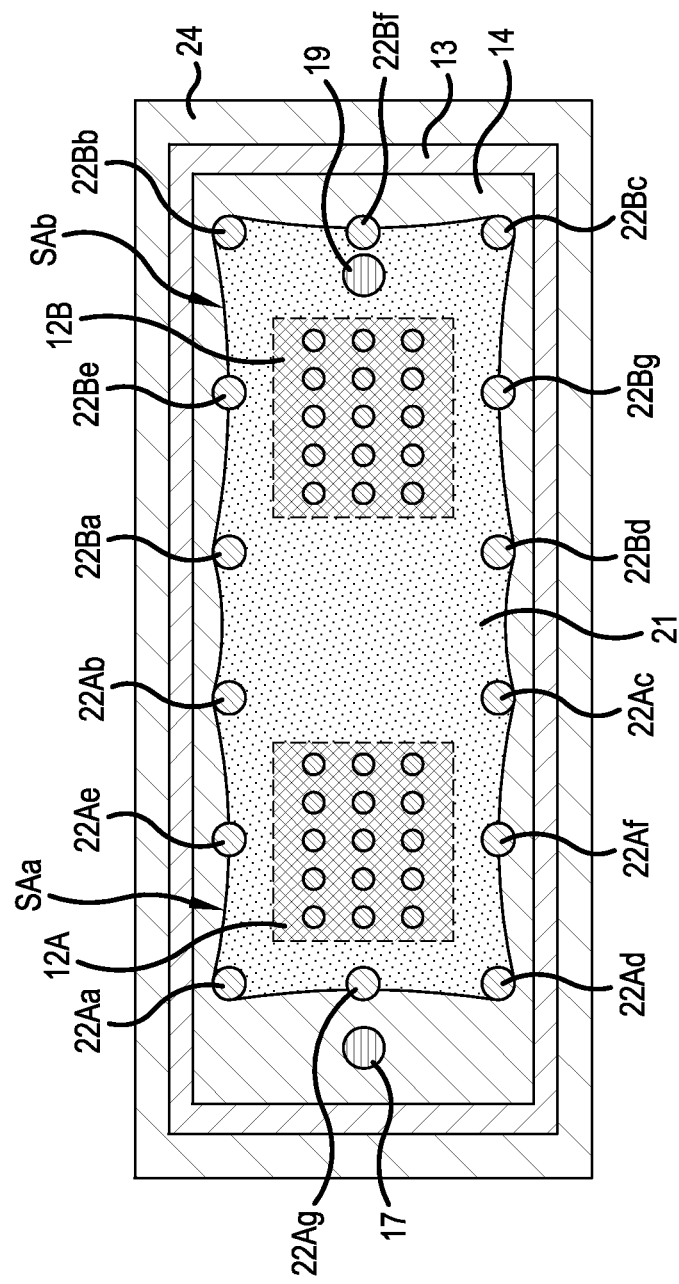
FIG. 4 is the same lateral sectional view as FIGS. 2A and 2B showing a modification example of the invention.

That is, as shown in FIG. 4, sealing region regulation rod portions 22Ae, 22Af, and 22Ag may be added between the sealing region regulation rod portions 22Aa and 22Ab, 22Ac and 22Ad, and 22Ad and 22Aa respectively. In the same way, sealing region regulation rod portions 22Be, 22Bf, and 22Bg may be added between the sealing region regulation rod portions 22Ba to 22Bd. In this case, it is possible to increase the attachment area between the sealing region regulation rod portions and under filling resin 21, because of which it becomes easier to maintain the form of the under filling resin 21 in the sealing regions SAa and SAb, and it is thus possible to more reliably regulate the sealing regions.

Also, in the heretofore described embodiment, a description has been given of a case wherein the whole of the space between the semiconductor chips 12A and 12B is filled with the under filling resin 21 by the under filling resin 21 being injected through the inlet 16a formed in a central portion of the printed substrate 16, but this is not limiting.

Figure 5:
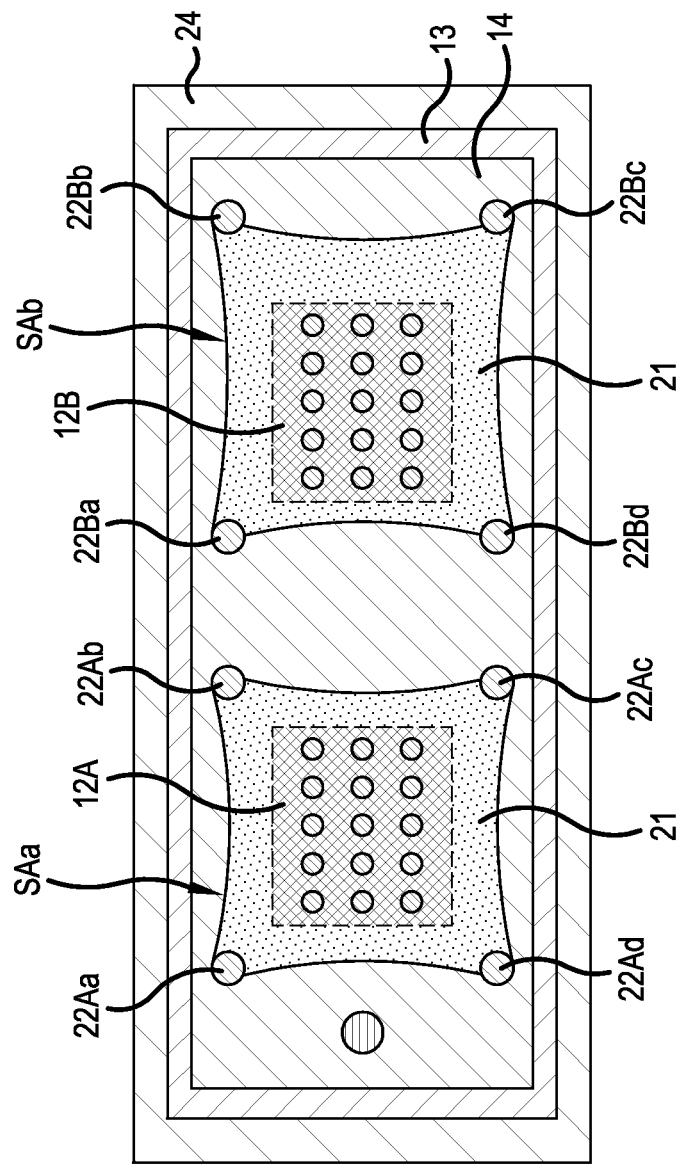
FIG. 5 is the same lateral sectional view as FIGS. 2A and 2B showing another modification example of the invention.

That is, as shown in FIG. 5, inlets may be formed in the printed substrate 16 directly above the semiconductor chips 12A and 12B and the under filling resin 21 injected, or the under filling resin 21 injected from side surface sides of the semiconductor chips 12A and 12B, thus forming the sealing regions SAa and SAb one each for the semiconductor chips 12A and 12B, covering the peripheries thereof. In this case, it is possible to reduce the amount of the under filling resin 21 filling the space between the semiconductor chips 12A and 12B, and thus possible to reduce the manufacturing cost commensurately. Also, as the space between the under filling resins 21 is filled with the epoxy resin 24 between the insulating substrate 11 and printed substrate 16, it is possible to further increase the adhesive strength of the epoxy resin 24.

Next, a description will be given, accompanying FIG. 6 to FIG. 11, of a second embodiment of the invention. The second embodiment is such that the invention is applied to a case wherein each of the semiconductor chips 12A and 12B in the first embodiment is configured of a plurality of chips.

That is, in the second embodiment, a power semiconductor module 30 acting as a semiconductor device is configured as shown in FIG. 6 to FIG. 11.

The power semiconductor module 30 includes a pair of main circuit components 33A and 33B, each configured by first semiconductor chips 32A and second semiconductor chips 32B being mounted on the insulating substrate 11, and a printed substrate 36 that configures a common wiring circuit above the main circuit components 33A and 33B.

The first semiconductor chips 32A are configured incorporating a power MOSFET (Metal-Oxide-Semiconductor Field-Effect Transistor) (or an insulated gate bipolar transistor (IGBT)). The second semiconductor chips 32B are configured incorporating a free wheeling diode (FWD).

Figure 8:
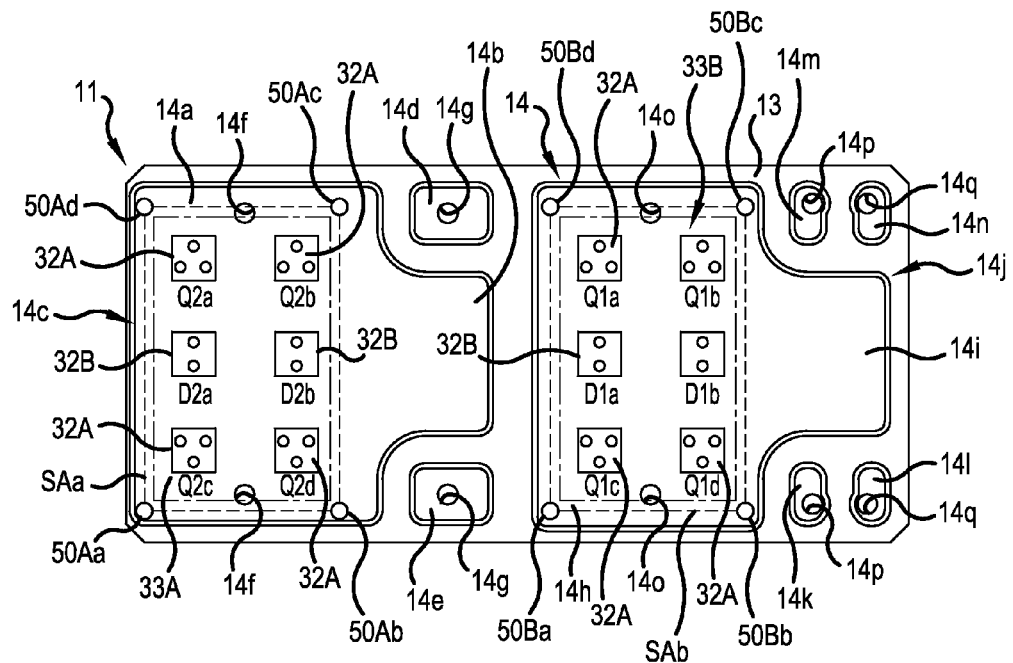
FIG. 8 is a plan view of an insulating substrate.

Further, four first semiconductor chips 32A and two second semiconductor chips 32B are mounted on the insulating substrate 11, as shown in FIG. 8. The second semiconductor chips 32B are disposed maintaining a predetermined interval on the longitudinal direction axis, and first semiconductor chips 32A are disposed maintaining a predetermined distance on either width direction outer side of the second semiconductor chips 32B.

Herein, the first semiconductor chips 32A have a drain terminal td, source terminal ts, and gate terminal tg, wherein the gate terminal tg is disposed so as to be on the end portion side opposite to that of the second semiconductor chip 32B.

Although the semiconductor chips 32A and 32B are one of the heretofore described kinds of power device, they may be formed on a silicon substrate, or may be formed on an SiC or other substrate.

The conductor pattern 14 formed on the substrate 13 of the insulating substrate 11, as shown in FIG. 8, has in a left end portion a chip mounting pattern 14c, formed in a T-shape in planar form, formed of a wide portion 14a having a width practically equivalent to the width of the substrate 13 and a narrow portion 14b, of a width less than that of the wide portion 14a, contiguous with the right side of the wide portion 14a.

Also, the conductor pattern 14 has independent terminal connection patterns 14d and 14e maintaining a predetermined interval on the outer sides of the narrow portion 14b of the chip mounting pattern 14c. Side edges of the terminal connection patterns 14d and 14e correspond to the side edges of the wide portion 14a of the chip mounting pattern 14c.

Herein, the first semiconductor chips 32A and second semiconductor chips 32B are mounted on the wide portion 14a of the chip mounting pattern 14c across a joining member such as solder, as shown in FIG. 8, and fitting holes 14f in which are press fitted conductive terminal pins 39 that form main circuit external connection terminals are formed on the width direction outer sides of the first semiconductor chips 32A. Meanwhile, fitting holes 14g in which are press fitted conductive terminal pins 40 that form source terminals acting as external connection terminals are formed in the terminal connection patterns 14d and 14e.

Also, the conductor pattern 14 is such that a chip mounting pattern 14j, formed in a T-shape in planar form of a wide portion 14h and narrow portion 14i, in the same way as the chip mounting pattern 14c, and two independently formed terminal connection patterns 14k, 14l and 14m, 14n maintaining a predetermined interval on the outer sides of the narrow portion 14i of the chip mounting pattern 14j, are formed in a right half portion.

Further, the first semiconductor chips 32A and second semiconductor chips 32B are mounted on the chip mounting pattern 14j across a joining member such as solder, as shown in FIG. 8, and fitting holes 14o in which are press fitted conductive terminal pins 38 that form drain terminals acting as external connection terminals are formed on the width direction outer sides of the first semiconductor chips 32A.

Fitting holes 14p in which are press fitted conductive terminal pins 41a and 41b that form source auxiliary terminals acting as external connection terminals are formed in the terminal connection patterns 14k and 14m. Fitting holes 14q in which are press fitted conductive terminal pins 42a and 42b that form gate terminals acting as external connection terminals are formed in the terminal connection patterns 14l and 14n.

Herein, it is desirable that the material of the conductive terminal pins 38, 40, and 39 is copper (Cu), which has excellent conductivity, or an aluminum (Al) series material. However, when taking into consideration ease of solder joining, it is possible to increase mounting efficiency by performing a nickel (Ni) or tin series surface processing on the conductive terminal pins 38, 40, and 39, thereby improving the wettability of the solder joining.

An anti-parallel connection circuit of, for example, n-channel MOSFETs (hereafter referred to simply as transistors) Q1a to Q1d forming first semiconductor chips 32A and FWDs (hereafter referred to as diodes) D1a and D1b forming second semiconductor chips 32B, configuring, for example, an upper arm, and an anti-parallel circuit of transistors Q2a to Q2d forming first semiconductor chips 32A and diodes D2a and D2b forming second semiconductor chips 32B, configuring a lower arm, are connected in series to the conductor pattern 14 of the insulating substrate 11.

Herein, as it is sufficient that the semiconductor chips (power devices) disposed on one insulating substrate 11 are such that the anti-parallel circuits of transistors and diodes are configured equivalently, there may be one each of the transistors and diodes, or the same multiple number thereof.

Further, the two anti-parallel circuits formed of the pairs of transistors Q1a to Q1d and Q2a to Q2d and the diodes D1a, D1b, D2a, and D2b are further connected in series via cylindrical post electrodes 37 acting as rod-form conductive connection members to the printed substrate 36 disposed on an upper aspect.

Instead of the case wherein the disposition of the two semiconductor chips 32A and 32B is such that the semiconductor chips 32A and 32B are disposed aligned in a front-back direction, as in FIG. 8, it is also possible for the semiconductor chips 32A and 32B to be disposed aligned in a left-right direction.

Further, drain electrodes of the transistors Q1a to Q1d (or Q2a to Q2d) are formed on the lower surfaces of the first semiconductor chips 32A, and are connected via the chip mounting pattern 14j (or 14c) of the conductor pattern 14 to the conductive terminal pins 38 acting as connection terminals that configure external input terminals (drain terminals D1) of the power semiconductor module 30 (or to the conductive terminal pins 39 that form main circuit external connection terminals (source-cum-drain terminals S1/D2)).

Cathode electrodes formed on the back surfaces of the second semiconductor chips 32B are also connected via the chip mounting pattern 14j (or 14c) to the conductive terminal pins 38 acting as connection terminals that configure external input terminals (the drain terminals D1) (or to the conductive terminal pins 39 acting as connection terminals that configure external output terminals (the source-cum-drain terminals S1/D2)).

Also, source electrodes and gate electrodes of the transistors Q1a to Q1d (or Q2a to Q2d) are formed on the front surfaces of the first semiconductor chips 32A, and each connected via post electrodes 37 to the printed substrate 36.

Also, anode electrodes are formed on the front surfaces of the second semiconductor chips 32B, and the anode electrodes are connected via post electrodes 37 to the printed substrate 36.

Figure 6:
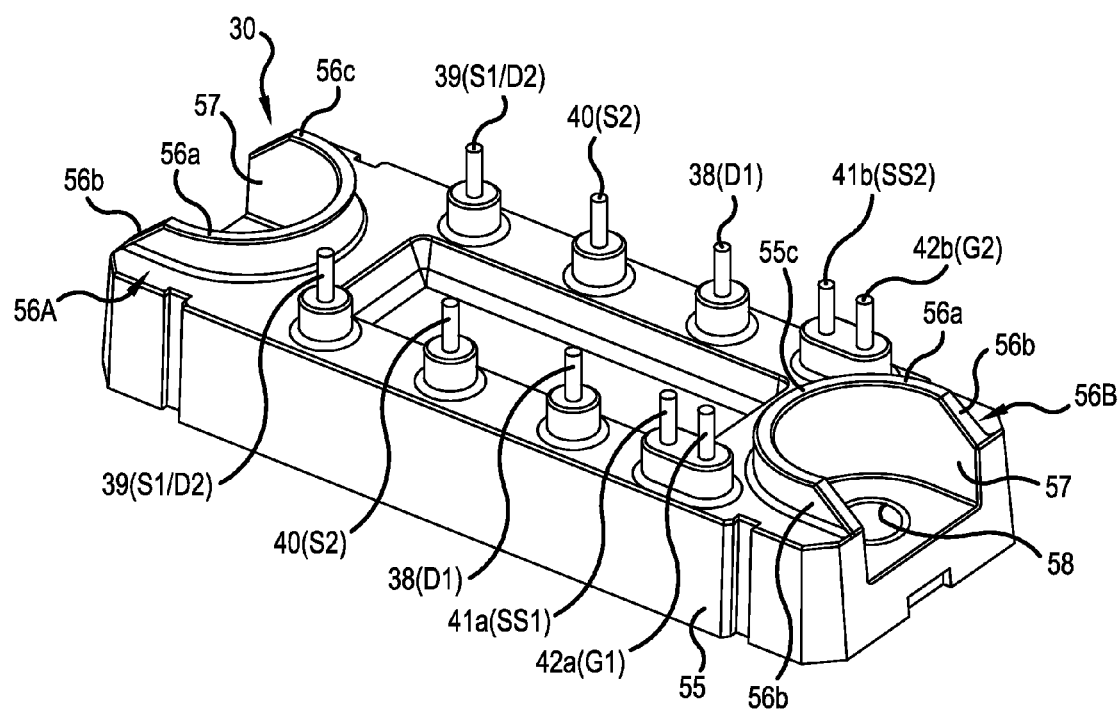
FIG. 6 is a perspective view showing a second embodiment of the semiconductor device according to the invention.

Two each of the conductive terminal pins 38 to 40 are formed in positions symmetrical across the width direction axis of the power semiconductor module 30, as shown in FIG. 6. Also, the power semiconductor module 30 further has a total of four conductive terminal pins 41a, 41b and 42a, 42b, two on either longitudinal direction outer side of the conductive terminal pins 38. The conductive terminal pins 38 to 40 and 41a, 41b, 42a, and 42b are disposed in two rows in practically straight lines along the two outer edges of the power semiconductor module 30.

The conductive terminal pins 41a and 41b are connected to the printed substrate 36 and configure current detector terminals SS1 and SS2, which are connected to a source that detects the current flowing between the drain and source of the half-bridge circuit transistors Q1a to Q1d and Q2a to Q2d and output a sense signal. Also, the remaining two conductive terminal pins 42a and 42b configure gate terminals G1 and G2 that supply a gate control signal to the gate electrodes of the transistors Q1a to Q1d and Q2a to Q2d.

Figure 9:
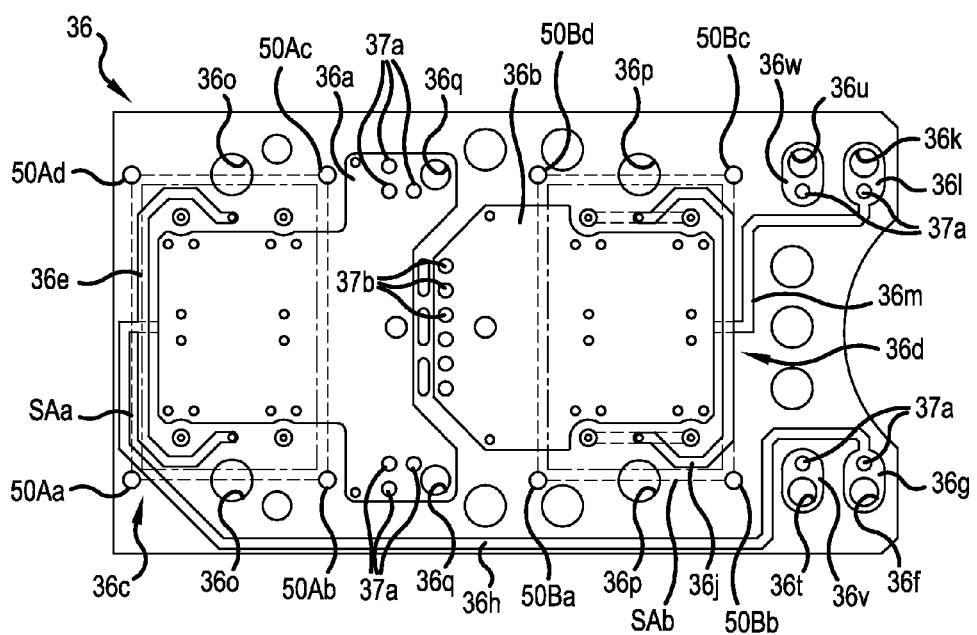
FIG. 9 is a plan view of a printed substrate.
Figure 10:
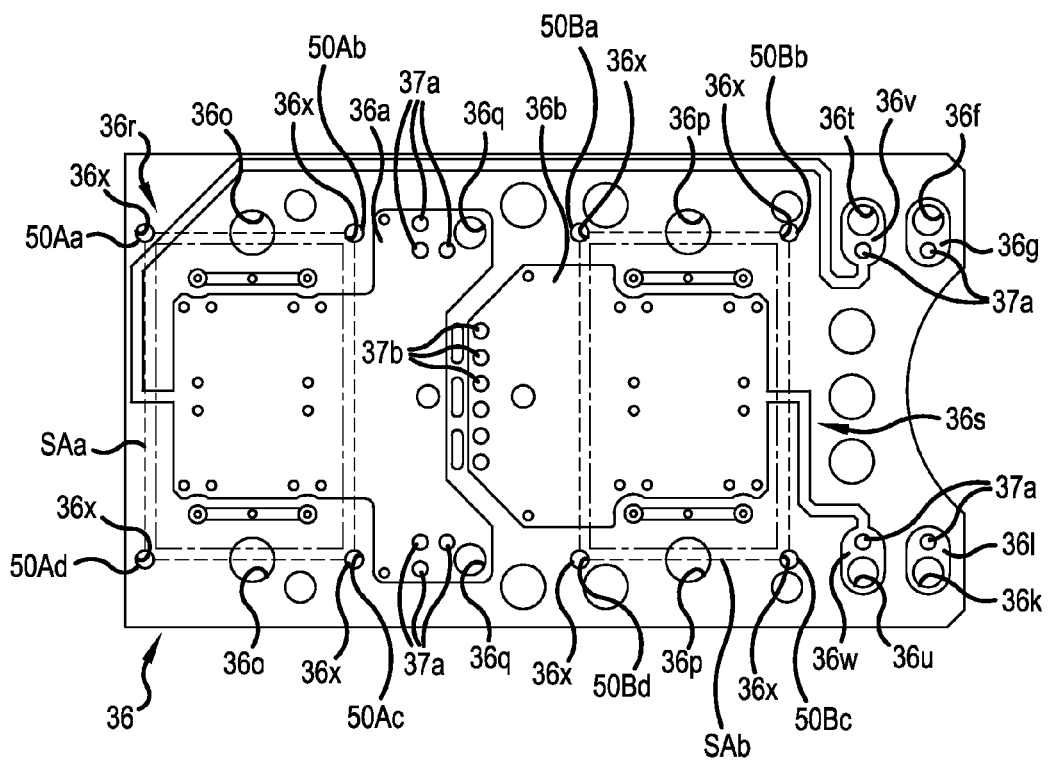
FIG. 10 is a bottom surface view of the printed substrate.

Also, the sealing region SAa of rectangular form seen from above is set so as to enclose the main circuit component 33A configured of four first semiconductor chips 32A and two second semiconductor chips 32B, as shown in FIG. 8 to FIG. 10. In the same way, the sealing region SAb of rectangular form seen from above is set so as to enclose the main circuit component 33B configured of four first semiconductor chips 32A and two second semiconductor chips 32B, as shown in FIG. 8 to FIG. 10.

Further, sealing region regulation rod portions 50Aa to 50Ad and 50Ba to 50Bd are fitted and supported in the wide portions 14a and 14h of the chip mounting patterns 14c and 14j in the four corner portions of the sealing regions SAa and SAb. The upper ends of the sealing region regulation rod portions 50Aa to 50Ad and 50Ba to 50Bd are engaged in through holes 36x formed in the printed substrate 36.

A wide conductor pattern 36a of a right-facing T-shape, which forms a current path of the main circuit component 33A, and a conductor pattern 36b, also wide, which forms a current path of the main circuit component 33B, are formed on the front surface side of the printed substrate 36, as shown in FIG. 9. Also, gate wiring paths 36c and 36d connected via the post electrodes 37 to the gate electrodes of the first semiconductor chips 32A of the main circuit components 33A and 33B are formed on the front surface of the printed substrate 36.

The gate wiring path 36c is configured of a crown-shaped pattern 36e and a connection pattern 36h. The crown-shaped pattern 36e is formed so as to enclose a narrow portion of the T-shaped conductor pattern 36a, maintaining a predetermined distance. The connection pattern 36h is extended along a side edge of the printed substrate 36 so as to link a central portion of the crown-shaped pattern 36e with a terminal connection pattern 36g formed on the periphery of an insertion hole 36f, pierced in a left end portion, through which the conductive terminal pin 42a is inserted.

The gate wiring path 36d is configured of a crown-shaped pattern 36j, formed so as to enclose a left side end portion of the conductor pattern 36b, and a connection pattern 36m formed in an approximate L-shape so as to link a central portion of the crown-shaped pattern 36j with a terminal connection pattern 36l formed on the periphery of an insertion hole 36k, pierced in a left end portion, through which the conductive terminal pin 42b is inserted.

Simple insertion holes 36o and 36p through which the conductive terminal pins 38 and 39 are inserted without contact, and through holes 36q through which the conductive terminal pins 40 are inserted without contact, are pierced in the printed substrate 36.

Herein, the through holes 36q are non-contact with respect to the conductive terminal pins 40, but when further inductance reduction is necessary, it is possible to reduce the wiring length by electrically connecting the through holes 36q and conductive terminal pins 40 by soldering or the like.

Furthermore, the wide conductor pattern 36a of a right-facing T-shape, which forms a current path of the main circuit component 33A, and the conductor pattern 36b are formed on the back surface of the printed substrate 36 so as to be superimposed on the front surface side conductor patterns 36a and 36b when seen in plan view, as shown in FIG. 10.

Also, source auxiliary terminal wiring paths 36r and 36s connected via post electrodes 37 to the sources of the transistors Q2a to Q2d of the main circuit component 33A and the sources of the transistors Q1a to Q1d of the main circuit component 33B are formed on the back surface of the printed substrate 36. The source auxiliary terminal wiring paths 36r and 36s are formed so as to be superimposed on the front side gate wiring paths 36c and 36d when seen in plan view, and are connected to terminal connection patterns 36v and 36w formed on the periphery of insertion holes 36t and 36u, formed on the left end, through which the conductive terminal pins 41a and 41b are inserted.

Herein, the end portions of the conductor pattern 36b nearer the conductor pattern 36a on the front and back of the printed substrate 36 are electrically connected to the narrow portion 14b of the chip mounting pattern 14c of the insulating substrate 11 by a plurality of, for example six, post electrodes 37b acting as rod-form conductive connection members, whereby a current path between the main circuit components 33A and 33B is formed by the post electrodes 37b.

Also, the conductor patterns 36a on the front and back of the printed substrate 36 are set to have the same potential as each other, and in the same way, the front and back conductor patterns 36b are also set to have the same potential as each other.

Figure 11:
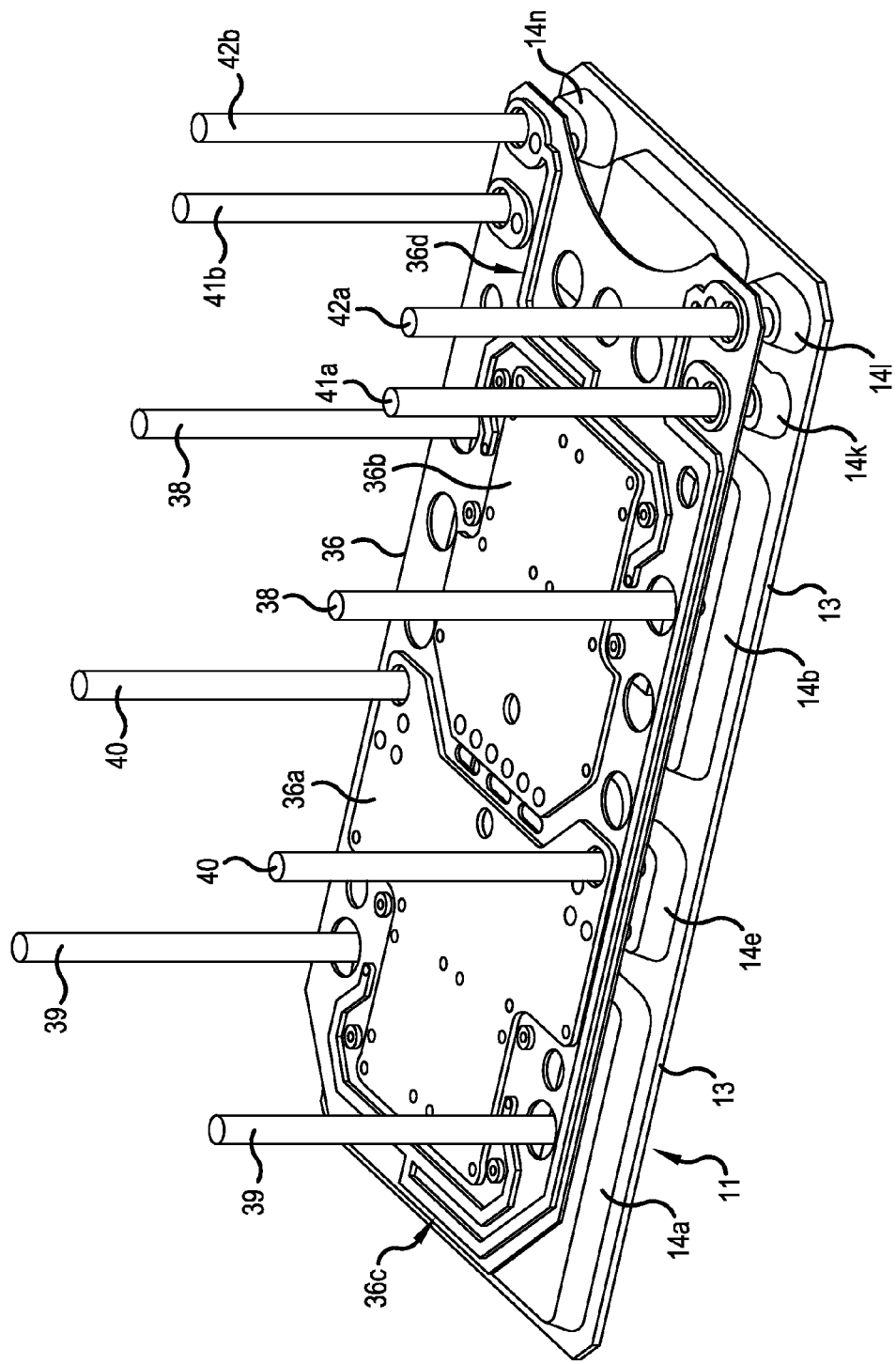
FIG. 11 is a perspective view showing a state wherein the printed substrate is assembled on the insulating substrate.
Figure 12A:
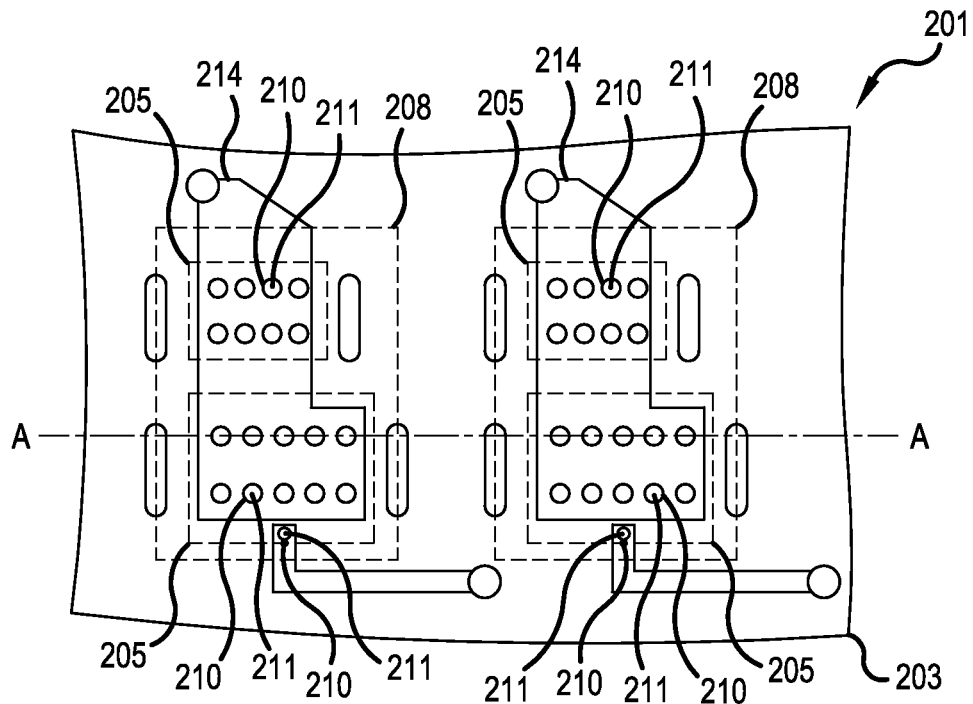
Figure 12B:
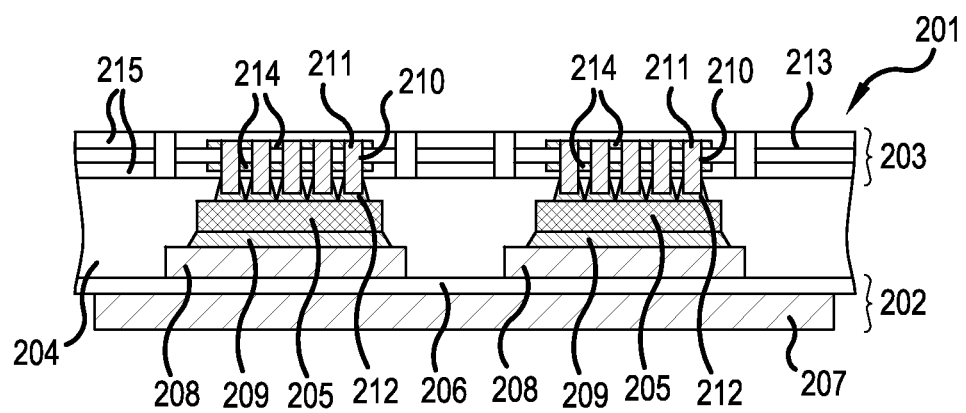
Figure 13:
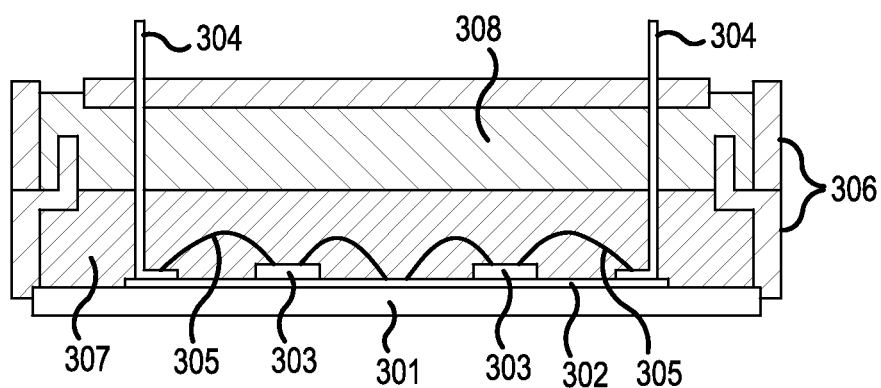
FIG. 13 is a sectional view showing another existing example.

Further, in a state wherein the conductive terminal pins 38 to 40, 41a, 41b, 42a, and 42b are press fitted into the main circuit components 33A and 33B and held vertically, the main circuit components 33A and 33B and the printed substrate 36 are joined as shown in FIG. 11. In this case, the conductive terminal pins 38, 39, 40, 41a, 41b, 42a, and 42b are inserted respectively through the insertion holes 36p, 36o, 36q, 36t, 36u, 36f, and 36k pierced in the printed substrate 36.

Also, the post electrodes 37 that form rod-form conductive connection members formed on the printed substrate 36 are brought into contact across solder with the first semiconductor chip 32A, second semiconductor chip 32B, and conductor pattern 14.

By a reflow process being carried out in this state, the post electrodes 37 of the printed substrate 36 are electrically and mechanically joined to the first semiconductor chip 32A, second semiconductor chip 32B, and conductor pattern 14.

Simultaneously with this, the insertion holes 36q, 36t, 36u, 36f, and 36k and the conductive terminal pins 40, 41a, 41b, 42a, and 42b are electrically joined via post electrodes 37a acting as rod-form conductive connection members. At this time, the sealing region regulation rod portions 50Aa to 50Ad and 50Ba to 50Bd are such that the lower ends are electrically connected to the chip mounting patterns 14c and 14j in the conductor pattern 14 of the insulating substrate 11, but as there is no connection to the conductor pattern on the printed substrate 36 side, the sealing region regulation rod portions 50Aa to 50Ad and 50Ba to 50Bd are not used as a current path.

After the main circuit components 33A and 33B and the printed substrate 36 are joined in this way, a predetermined amount of an under filling resin 51 is injected into the sealing regions SAa and SAb between the conductor pattern 14 of the insulating substrate 11 and the printed substrate 36 from, for example, a front end side between the conductor pattern 14 and printed substrate 36, using a syringe, or the like, filled with the under filling resin 51 acting as a second sealing member.

Owing to the injection of the under filling resin 51, when the injected under filling resin 51 reaches the sealing region regulation rod portions 50Aa to 50Ad and 50Ba to 50Bd, the under filling resin 51 moves so as to be suctioned up to an upper portion along the surfaces of the sealing region regulation rod portions 50Aa to 50Ad and 50Ba to 50Bd, and attempts to concentrate in the peripheries of the sealing region regulation rod portions 50Aa to 50Ad and 50Ba to 50Bd, in the same way as in the first embodiment.

At this time, owing to the surface tension of the under filling resin 51, a large amount of the under filling resin 51 is drawn to the sealing region regulation rod portion 50Aa to 50Ad and 50Ba to 50Bd sides, covering the periphery of the semiconductor chips 32A and 32B, and covering the upper surfaces of the semiconductor chips 32A and 32B, whereby the under filling resin 51 completely fills the inside of the sealing regions SAa and SAb.

Herein, the sealing regions SAa and SAb, as shown in FIG. 8 to FIG. 10, are of an extent completely covering the side surfaces of the semiconductor chips 32A and 32B and smaller than the conductor pattern 14 of the insulating substrate 11, and of an extent smaller than the printed substrate 36.

Because of this, a laterally inclined U-shaped portion 53 is formed, enclosed on three side surface sides, including longitudinal direction end portions of the insulating substrate 11 and printed substrate 36, by the upper surface of the conductor pattern 14 of the insulating substrate 11, a side surface of the under filling resin 51, and the lower surface of the printed substrate 36.

At this time, it is possible to increase the attachment area of an epoxy resin 54, to be described hereafter, with the U-shaped portion 53. Moreover, the upper and lower inner surfaces forming the U-shaped portion 53 are configured of the conductor pattern 14 of the insulating substrate 11 and the conductor pattern formed on the lower surface of the printed substrate 36, formed of copper, which has high adhesive strength with respect to the epoxy resin 54 to be described hereafter.

In this state, after covering with a resin injection die (not shown) excepting the bottom surface of the heat releasing heat transfer pattern 15 of the insulating substrate 11, the low-cost epoxy resin 54, acting as a second sealing resin with a heat resistance temperature lower than that of the under filling resin 51, is injected. By so doing, mold molding is carried out, sealing the insulating substrate 11, under filling resin 51, sealing region regulation rod portions 50Aa to 50Ad and 50Ba to 50Bd, and printed substrate 36 with the epoxy resin 54.

Figure 7:
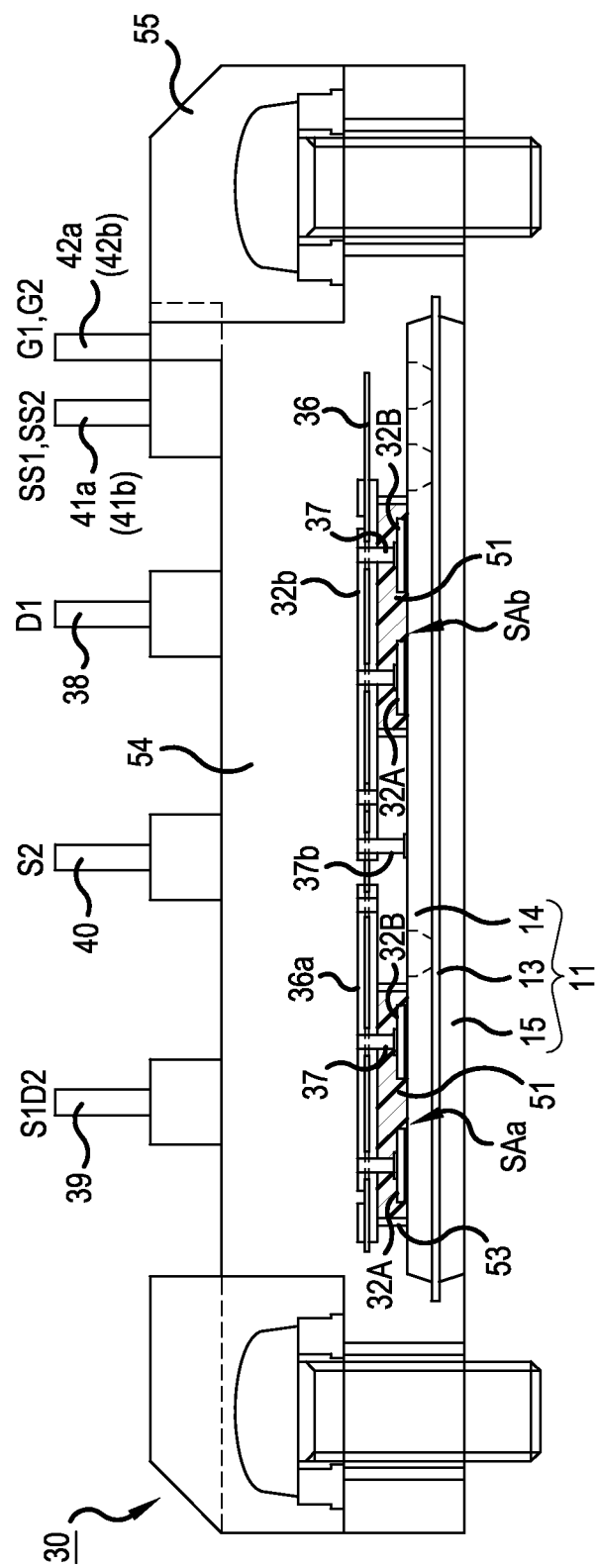
FIG. 7 is a vertical sectional view of the second embodiment.

At this time, the epoxy resin 54, as shown in FIG. 7, enters the U-shaped portion 53 enclosed on side surface sides by the conductor pattern 14 of the insulating substrate 11, the under filling resin 51, and the printed substrate 36. Also, the epoxy resin 54 is injected so as to fill the space between the under filling resin 51 filling the sealing regions SAa and SAb in a longitudinal direction central portion. Consequently, it is possible by form to reliably suppress detachment between the epoxy resin 54 and the insulating substrate 11 and printed substrate 36.

At this time, as previously described, the epoxy resin 54 comes into contact with the conductor pattern 14 of the insulating substrate 11 and the conductor pattern of the printed substrate 36 on the upper and lower surfaces of the U-shaped portion 53, because of which comparatively high adhesive strength is obtained. Because of this, even when carrying out a temperature cycle test or the like, no detachment of the epoxy resin 54 occurs on the outer peripheral side, and it is possible to reliably suppress resin cracking and substrate damage. Consequently, it is possible to increase the reliability of the semiconductor device.

By mold molding being carried out in this way, the external form of the power semiconductor module 30 is formed overall as a cuboid mold molded body 55 forming a quadrilateral form when seen from above, as shown in FIG. 6.

Further, insulating wall portions 56A and 56B are formed one on either longitudinal direction end portion side of the mold molded body 55, as shown in FIG. 6. The insulating wall portions 56A and 56B are formed of a U-shaped protruding portion 56c and a U-shaped portion 57.

The U-shaped protruding portion 56c is configured of a semi-cylindrical protruding portion 56a of a comparatively large diameter, formed inwardly of a longitudinal direction end face of the mold molded body 55 and protruding from the front surface, and side wall portions 56b extending tangentially to the end face of the mold molded body 55 from either end face of the semi-cylindrical protruding portion 56a.

The U-shaped portion 57 is contiguous with the inner peripheral surface of the U-shaped protruding portion 56c, is hollowed out to a thickness approximately half that of the mold molded body 55, and has a configuration wherein an end face side is opened.

An attachment hole 58 centered on, for example, the central axis of the semi-cylindrical protruding portion 56a is formed penetrating the bottom surface of the mold molded body 55 in a bottom portion of the U-shaped portion 57 configuring the insulating wall portions 56A and 56B. Herein, the inner diameter of the semi-cylindrical protruding portion 56a of the insulating wall portions 56A and 56B is set to be a diameter greater than a head portion of a fitting such as an attachment bolt or attachment screw to be inserted through the attachment hole 58. Also, the semi-cylindrical protruding portion 56a is set to have a wall face height such that it is quite possible to secure the creepage distance necessary between the adjacent conductive terminal pins 38, 42a, and 42b and the head portion of the fitting.

Further, by connecting the conductive terminal pins 38 to 40 individually to a main terminal rod and connecting the conductive terminal pins 41a, 41 b, 42a, and 42b to a drive circuit via wire wiring or printed wiring, in a state wherein the necessary number of the power semiconductor module 30 having the heretofore described configuration are disposed in parallel, it is possible to form, for example, the U-phase of an inverter circuit. By three of these configurations being combined, it is possible to form the U-phase, V-phase, and W-phase of an inverter circuit.

In this way, in the second embodiment too, it is possible to accurately fill the predetermined sealing regions SAa and SAb with the under filling resin 51 acting as a first sealing member so as to cover the plurality of semiconductor chips 32A and 32B, utilizing the surface tension of the under filling resin 51 by using the sealing region regulation rod portions 50Aa to 50Ad and 50Ba to 50Bd.

Moreover, as the periphery of the under filling resin 51 is covered between the insulating substrate 11 and printed substrate 36 with the epoxy resin 54 acting as a second sealing member, filling is carried out with no detachment of the epoxy resin 54 occurring on the periphery of the under filling resin 51. Because of this, it is possible to obtain the same operational advantages as in the first embodiment. Moreover, only regions covering the plurality of semiconductor chips 32A and 32B are filled with the under filling resin 51, because of which it is possible to reduce the amount of the under filling resin 51 used to a minimum, and thus possible to further reduce the manufacturing cost.

On top of this, in the second embodiment, the conductive terminal pins 39 and 38 fitted into the conductor pattern 14 pass along the outer peripheral edges of the sealing regions SAa and SAb, because of which the conductive terminal pins 39 and 38 can also be utilized as sealing region regulation rod portions, and it is thus possible to carry out the formation of the sealing regions SAa and SAb more accurately.

In the first and second embodiments, a description has been given of a case wherein the sealing region regulation rod portions 22Aa to 22Ad and 22Ba to 22Bd, and 50Aa to 50Ad and 50Ba to 50Bd, are formed of copper but, this not being limiting, they may be made of metal or a synthetic resin, provided that the material has high wettability with respect to the under filling resins 21 and 51. Also, the form of the rod portions not being limited to a cylindrical form, the rod portions may be formed in a rod form having an elliptical cross-section, or a prismatic form having a polygonal cross-section, such as a triangular form or quadrilateral form.

Also, in the first and second embodiments, a description has been given of a case wherein the sealing regions SAa and SAb are formed in a rectangular form as seen from above but, this not being limiting, it is possible to adopt any form in accordance with the disposition and form of the semiconductor chips.

Also, in the first and second embodiments, the number of the sealing region regulation rod portions 22Aa to 22Ad, 22Ba to 22Bd, 50Aa to 50Ad, and 50Ba to 50Bd regulating the sealing regions SAa and SAb not being limited to four, it is sufficient that the number is set in accordance with the surface tension of the under filling resins 21 and 51 and the lengths of the sides of the sealing regions SAa and SAb to be a number such that it is possible to prevent the under filling resins 21 and 51 from flowing out.

Also, the insulating substrate 11 in the first and second embodiments not being limited to the heretofore described configuration, it is possible to apply a so-called AMB (Active Metal Brazing) substrate, wherein a ceramic and copper are brazed and the copper patterned by etching, a DCB (Direct Copper Bonding) substrate wherein a ceramic substrate and copper are joined directly, or the like. Also, it is possible to apply alumina ($Al_2O_3$), aluminum nitride (AlN), silicon nitride ($Si_3N_4$), or the like, as the ceramic substrate material. Furthermore, it is also possible to apply a resin substrate instead of a ceramic substrate. That is, it is sufficient that the substrate is such that it is possible to ensure insulation.

Also, in the first and second embodiments, a description has been given of a case wherein the printed substrates 16 and 36 and semiconductor chips 12A, 12B, 32A, and 32B are connected by the cylindrical post electrodes 18 and 37 but, this not being limiting, it is possible to apply post electrodes of an optional form, such as a quadrilateral prism, triangular prism, polygonal prism, or elliptical prism.

Also, in the first and second embodiments, a description has been given of a case wherein a power MOSFET is incorporated in the first semiconductor chips 12A and 32A but, this not being limiting, an IGBT may be incorporated in the first semiconductor chips 12A and 32A, or another voltage controlling semiconductor element may be incorporated.

Also, in the first and second embodiments, a description has been given of a case wherein a plurality of the first semiconductor chips 12A and 32A and second semiconductor chips 12B and 32B are disposed on the insulating substrate 11 but, this not being limiting, it is possible to eliminate the free wheeling diode, and configure using only a power semiconductor switching element such as a power MOSFET or IGBT, when it is possible to use a diode incorporated in a transistor, when employing a synchronous rectification method, or the like.

Also, as the invention is such that the desired circuit configuration is obtained simply by combining semiconductor module terminal connections, the invention, not being limited to the heretofore described power converting inverter device, can be applied to other power conversion devices using a power semiconductor module, or to other semiconductor devices, such as a high frequency use switching IC.

What is claimed is:

1. A semiconductor device, comprising:
   an insulating substrate on which is mounted a main circuit component including a semiconductor chip;
   a printed substrate, opposing the insulating substrate, wherein a conductive connection member connected to the semiconductor chip is disposed on the surface opposing the insulating substrate;
   a first sealing member that seals so as to enclose the semiconductor chip between the opposing surfaces of the insulating substrate and the printed substrate;
   a second sealing member that covers the side surfaces, but not the bottom surface, of the insulating substrate, the side surfaces of the first sealing member, and the side surfaces and upper surface of the printed substrate; and
   a sealing region regulation rod portions disposed in an outermost side peripheral portion of a sealing region of the first sealing member and connected between the insulating substrate and the printed substrate, the sealing region regulation rod portions being disposed such that they do not penetrate the second sealing member, wherein
   the heat resistance temperature of the first sealing member is higher than the heat resistance temperature of the second sealing member.

2. The semiconductor device according to claim 1, wherein the sealing region regulation rod portions are disposed in corner portions regulating the outer peripheral portion of the sealing region of the first sealing member.

3. The semiconductor device according to claim 1, wherein the sealing region regulation rod portions support the liquid first sealing member using a surface tension thereof.

4. The semiconductor device according to claim 1, wherein the sealing region of the first sealing member is set to be smaller than the outer peripheries of the insulating substrate and the printed substrate.

5. The semiconductor device according to claim 1, wherein the sealing region regulation rod portions are formed of a member having high wettability with respect to the first sealing member.

6. The semiconductor device according to claim 1, wherein the sealing region regulation rod portions are fitted into and held in fitting holes formed in the insulating substrate.

7. The semiconductor device according to claim 1, wherein the sealing region regulation rod portions are formed of conductors that electrically connect a conductor pattern of the insulating substrate and a conductor pattern of the printed substrate.

8. The semiconductor device according to claim 1, wherein the sealing region regulation rod portions are formed of an insulating resin having high wettability with respect to the first sealing member.

9. The semiconductor device according to claim 1, wherein the sealing region of the first sealing member is disposed for each semiconductor chip when a plurality of the semiconductor chip are disposed.

10. The semiconductor device according to claim 1, wherein a disposition interval of the sealing region regulation rod portions is set in accordance with a surface tension of the first sealing member.

11. The semiconductor device according to claim 1, wherein an inlet through which the first sealing member is injected between the insulating substrate and the printed substrate is formed in either one of the insulating substrate and the printed substrate.

12. The semiconductor device according to claim 1, wherein the semiconductor chip is a power semiconductor element.

* * * * *